United States Patent
Sawamura et al.

(10) Patent No.: US 8,212,467 B2
(45) Date of Patent: Jul. 3, 2012

(54) LIGHT EMITTING DEVICE

(75) Inventors: Makoto Sawamura, Osaka (JP);
Shigetoshi Ito, Osaka (JP); Shuichi Hirukawa, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 12/994,583

(22) PCT Filed: May 25, 2009

(86) PCT No.: PCT/JP2009/059521
§ 371 (c)(1), (2), (4) Date: Nov. 24, 2010

(87) PCT Pub. No.: WO2009/145141
PCT Pub. Date: Dec. 3, 2009

(65) Prior Publication Data
US 2011/0068679 A1    Mar. 24, 2011

(30) Foreign Application Priority Data
May 26, 2008 (JP) ................................. 2008-137017

(51) Int. Cl.
*H01J 1/62* (2006.01)
(52) U.S. Cl. .................... 313/498; 313/501; 313/512
(58) Field of Classification Search ............ 313/498, 313/501–503, 512
See application file for complete search history.

(56) References Cited

U.S. PATENT DOCUMENTS

| 7,462,983 | B2 * | 12/2008 | Baroky et al. ............. 313/503 |
| 2004/0263074 | A1 | 12/2004 | Baroky et al. |
| 2007/0263678 | A1 | 11/2007 | Mizuuchi et al. |
| 2009/0003400 | A1 | 1/2009 | Nagahama et al. |

FOREIGN PATENT DOCUMENTS

| EP | 1-926-154 | 5/2008 |
| JP | 11-87778 | 3/1990 |
| JP | 2005-20010 | 1/2005 |
| JP | 2008-153617 | 7/2008 |
| JP | 2009-99664 | 5/2009 |
| JP | 2009-105125 | 5/2009 |
| WO | WO-2005/088787 | 9/2005 |
| WO | WO-2007/105647 | 9/2007 |

OTHER PUBLICATIONS

International Search Report mailed Jun. 23, 2009 directed towards PCT/JP2009/059521; 1 page.

* cited by examiner

*Primary Examiner* — Vip Patel
(74) *Attorney, Agent, or Firm* — Morrison & Foerster LLP

(57) ABSTRACT

A light emitting device includes a light emitting element, a cap sealing the light emitting element, and a light conversion structural section covering an upper surface of the cap. The cap includes a base section having a hole for taking out light emitted from the light emitting element, and a glass section overlaid on the hole. The glass section is provided outside the base section, and the light conversion structural section is provided outside the glass section. According to this light emitting device, manufacturing cost can be reduced by suppressing reduction in yield.

6 Claims, 6 Drawing Sheets

(a)

(b)

(c)

LIGHT EMITTING DEVICE

TECHNICAL FIELD

The present invention relates to a light emitting device combining a light emitting element and a light conversion structural section.

BACKGROUND ART

At present, solid-state illumination devices using light emitting diodes (LED), semiconductor laser elements, and the like are studied actively as illumination devices serving as an alternative to fluorescent lamps. Since these solid-state illumination devices are mercury-free light emitting devices not using mercury harmful to the human body, they are attracting attention as environment-friendly devices.

FIG. 11 is a cross sectional view showing one form of a conventional light emitting device using a semiconductor laser element.

As shown in FIG. 11, the conventional light emitting device is fabricated by mounting a submount 32 packaging a semiconductor laser element 31 on a stem 33, providing a cap 34 onto them, welding cap 34 to stem 33, and sealing semiconductor laser element 31. Cap 34 has a base section having a hole for taking out light and a glass section 35 covering the hole, and glass section 35 is mounted inside the base section.

FIG. 12 is a cross sectional view showing another form of a conventional light emitting device using a semiconductor laser element. The light emitting device shown in FIG. 12 is a light emitting device obtained by further adding the function of a wavelength conversion element and the like to the light emitting device of FIG. 11. That is, the light emitting device shown in FIG. 12 has a structure in which a functional film having a function such as the function of a wavelength conversion element is provided on a surface of a glass section. The light emitting device is fabricated by soldering a submount 62 packaging a semiconductor laser element 61 onto a base 63, welding a cap 64 onto base 63, and thereby sealing semiconductor laser element 61.

Cap 64 has a base section having a hole for taking out light and a glass section 65 covering the hole, and glass section 65 is mounted inside the base section of cap 64. Further, a wavelength conversion element 66 and a functional film 67 are provided on a surface of glass section 65, and functional film 67 has a photocatalytic effect by receiving light with a specific wavelength.

With a structure as described above, a portion of light 68 emitted from semiconductor laser element 61 is wavelength-converted by wavelength conversion element 66, and a photocatalytic effect is obtained on a surface of functional film 67 by the wavelength-converted light. The photocatalytic effect can suppress foreign matter from attaching to a surface of a package of the light emitting device and deteriorating properties of the light emitting device.

PRIOR ART DOCUMENTS

Patent Documents

Patent Document 1: International Publication No. 2005/088787 pamphlet

SUMMARY OF THE INVENTION

Problems to be Solved by the Invention

However, the light emitting device described above has a problem that, when structural objects such as a resin mold containing a phosphor, a wavelength conversion element, and a functional film are mounted on the glass section, a pressure is exerted on the glass section and thereby the glass section may fall onto the semiconductor laser element, causing reduction in yield during the manufacturing process of the light emitting device. In conventional light emitting devices, it has been necessary to provide a glass section under a base section to maintain air tightness inside a cap and easily manufacture the cap.

The present invention has been made in view of circumstances as described above, and one object of the present invention is to provide a light emitting device of which manufacturing cost is reduced by suppressing reduction in yield during a manufacturing process.

Means for Solving the Problems

The inventors of the present invention focused on the position where a glass section is provided in a light emitting device and the structure of a cap, earnestly studied these structures, and thus completed the present invention.

The present invention relates to a light emitting device, including a light emitting element, a cap sealing the light emitting element, and a light conversion structural section covering an upper surface of the cap, wherein the cap includes a base section having a hole for taking out light emitted from the light emitting element, and a glass section overlaid on the hole, the glass section is provided outside the base section, and the light conversion structural section is provided outside the glass section.

Preferably, the light conversion structural section described above is a resin mold containing a phosphor, and the light emitting element emits excitation light exciting the phosphor.

Preferably, the light emitting element described above is a semiconductor laser element.

Effects of the Invention

According to the present invention, a light emitting device in which, even if a pressure is exerted on a glass section, the glass section is suppressed from falling onto a light emitting element by devising positions of a light conversion structural section and the glass section, and thus yield is less likely to be reduced, can be provided.

MODES FOR CARRYING OUT THE INVENTION

Figure 1:
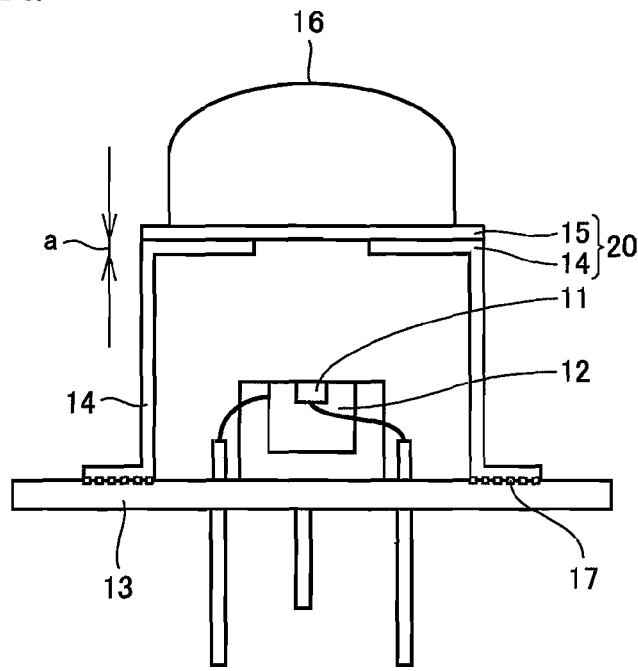
FIG. 1 is a schematic cross sectional view showing a light emitting device in a first embodiment of the present invention.

Hereinafter, embodiments of the present invention will be described with reference to the drawings. In the drawings below, identical or corresponding parts will be designated by the same reference characters, and the description thereof will not be repeated. Further, the dimensional relationship among lengths, sizes, widths, and the like in the drawings is changed as appropriate for clarity and simplicity of the drawings, and does not represent actual dimensions.

First Embodiment

Figure 2:
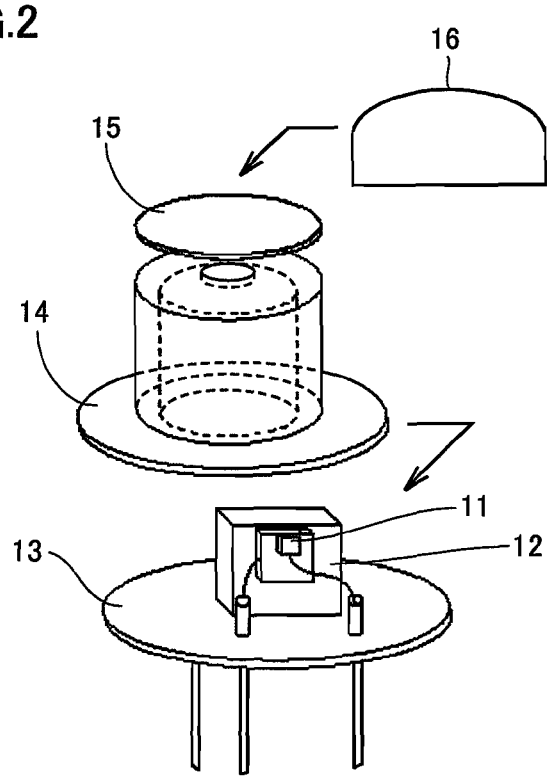
FIG. 2 is a schematic perspective view showing the light emitting device in the first embodiment of the present invention.

FIG. 1 is a schematic cross sectional view showing a light emitting device in a first embodiment of the present invention, and FIG. 2 is a schematic perspective view showing the light emitting device in the first embodiment of the present invention.

The light emitting device shown in FIGS. 1 and 2 includes a light emitting element 11, a cap 20 sealing light emitting element 11, and a light conversion structural section 16 covering an upper surface of cap 20. Light emitting element 11 is soldered onto a submount 12, and submount 12 is provided on a stem 13. A base section 14 of cap 20 is welded to stem 13 at a weld section 17. A glass section 15 is provided outside base section 14, and light conversion structural section 16 is provided on an upper surface of glass section 15. It is to be noted that the term "outside" of base section 14 means a side opposite to a space in which light emitting element 11 is sealed with cap 20 (inside the base section). By providing glass section 15 outside base section 14 as described above, manufacturing yield of the light emitting device can be improved, and the light emitting device can be fabricated at low cost.

(Cap)

Cap 20 includes base section 14 having a hole for taking out light emitted from light emitting element 11, and glass section 15 overlaid on the hole. Cap 20 as described above can be of any shape without being particularly limited, as long as the shape can form a space sealing light emitting element 11 when a leg of base section 14 is bonded to a member to which light emitting element 11 is fixed (such as submount 12 and stem 13).

Specifically, the outer shape of cap 20 is not particularly limited, as long as cap 20 has a three-dimensional shape having a cavity inside, and may be of any of a cylindrical shape, a columnar shape, and a hemispherical shape. Further, an external diameter of the cap as described above and an internal diameter of the cavity inside the cap may not necessarily be constant.

(Base Section)

It is preferable that base section 14 included in cap 20 is provided such that an upper surface of base section 14 is parallel to a bottom surface of stem 13, from the viewpoint of stably placing glass section 15. It is also preferable that a region around the hole in the upper surface of base section 14 included in cap 20 is a flat surface. Here, the "upper surface" of base section 14 refers to a surface on a side from which the light is emitted, of both surfaces of base section 14. By forming the region around the hole in the upper surface of base section 14 to be a flat surface, glass section 15 can be placed on the region around the hole even when a material not having flexibility is used for glass section 15.

Preferably, base section 14 as described above has a top hat shape having a cylindrical outer shape, having a cavity inside, and having an upper surface as a flat surface and a foot provided with a planar collar, as shown in FIGS. 1 and 2. By forming base section 14 to have a top hat shape as described above, a foot section of base section 14 is fixed to stem 13 and the like, and thus cap 20 can be firmly fixed on stem 13 and light emitting element 11 can be sealed inside cap 20 more reliably.

It is preferable that a material having a thermal expansion coefficient that is approximate to a thermal expansion coefficient of a material for the glass section over a wide temperature range is used as the material for base section 14, from the viewpoint of strengthening bonding to glass. Preferably, base section 14 as described above is made of a material such as a Fe—Ni alloy, a Fe—Ni—Co alloy (hereinafter also referred to as "kovar"), invar-brass, nickel-titanium, copper-aluminum-nickel, phosphor bronze, beryllium copper, SUS, titanium, and the like, and more preferably, base section 14 is made of kovar, from the viewpoint that it is a material having a thermal expansion coefficient substantially identical to the thermal expansion coefficient of glass. In addition, kovar produces a black to gray oxide film when heated to not less than 650° C., and when the oxide film is melted and mixed with glass, bonding between base section 14 and glass section 15 can be further strengthened.

Preferably, a thickness a of the upper surface of base section 14 is 300 to 600 μm, from the viewpoint of having a strength supporting glass section 15 and light conversion structural section 16. A thickness of the foot of base section 14 is not particularly limited and may be thin, as long as cap 20 can be fixed to stem 13.

In addition, it is preferable that a thickness of base section 14 at a portion other than the upper surface is 100 to 400 μm, although it depends on a material thereof. If kovar is selected as a material for base section 14, it is more preferable that the thickness is 100 to 400 μm. By using kovar for base section 14, lightweight and robust base section 14 can be obtained, and base section 14 can protect light emitting element 11 therein without being broken even when volumes and masses of glass section 15 and light conversion structural section 16 are increased.

The position, shape, size, and the like of the hole in base section 14 can be set as appropriate to efficiently take out the light from light emitting element 11. That is, it is preferable that the hole in base section 14 is designed to directly take out the light emitted by light emitting element 11. Although FIG. 2 shows the case where the hole is placed in the center of the upper surface of base section 14 included in cap 20, the position of the hole is not limited thereto, and the position of the hole in base section 14 can be set as appropriate depending on the position where light emitting element 11 is provided. The shape of the hole in base section 14 is not limited to a circular shape, and may be, for example, a rectangular shape, an elliptical shape, and the like. However, it is preferable that the hole is large enough not to inhibit traveling of the light emitted from light emitting element 11, because, if the hole is too small, the hole inhibits traveling of the light emitted from light emitting element 11.

Further, a surface forming the hole in base section 14 included in cap 20 may be coated and reinforced. By coating base section 14 as described above, the strength of the hole can be improved, preventing cap 20 from being damaged even if a pressure due to weights of glass section 15 and light conversion structural section 16 is exerted.

(Glass Section)

Glass section 15 may have any shape, as long as the shape has an area larger than that of the hole in base section 14 included in cap 20. Specifically, although FIGS. 1 and 2 show glass section 15 having a shape and an area identical to those of the upper surface of base section 14 included in cap 20, the shape of glass section 15 is not limited thereto, and glass section 15 may have a different shape. Preferably, glass section 15 has a thickness of about 200 to 300 μm.

Further, a material for glass section 15 is not limited to ordinary low-melting-point glass only, as long as the material has a high light transmission property and is stable in terms of property like low-melting-point glass. As a material for glass section 15, another glass may be used, or a transparent resin such as an acrylic resin and an epoxy resin may be used. If base section 14 included in cap 20 has a hemispherical outer shape, or the region around the hole provided in base section 14 is curved, glass section 15 can be placed to fit to the region around the hole by using a transparent resin such as an acrylic resin and an epoxy resin as a material for glass section 15.

(Light Conversion Structural Section)

Light conversion structural section 16 has functions of converting (changing) a wavelength and a traveling direction of the light emitted from light emitting element 11, and emitting light with various wavelengths by being excited by the light emitted from light emitting element 11. Examples of such light conversion structural section 16 can include a resin mold containing a phosphor emitting light with various wavelengths by being excited by the light emitted from light emitting element 11, a polarization plate converting a vibration direction of the light emitted from light emitting element 11, a diffuser plate diffusing the light emitted from light emitting element 11, an optical component such as a lens refracting the light emitted from light emitting element 11 to diffuse or focus the light, an optical fiber transmitting light, and the like.

The size, form, and mass of light conversion structural section 16 can be selected as appropriate depending on the size of the light emitting device, as long as glass section 15 does not delaminate from base section 14 due to the size, form, and mass of light conversion structural section 16 when light conversion structural section 16 is provided on glass section 15.

Preferably, light conversion structural section 16 is a resin mold containing a phosphor. When light emitting element 11 emits excitation light exciting the phosphor, the light emitting device can be set to emit light of a desired color by selecting the excitation light of light emitting element 11 and a light emission wavelength of the phosphor as appropriate. Light conversion structural section 16 may have any shape such as a spherical shape and a cylindrical shape, as long as light conversion structural section 16 can cover the hole in base section 14 and be bonded thereto. However, it is preferable that light conversion structural section 16 has a hemispherical shape obtained by dividing a sphere into halves, from the viewpoint of efficiently emitting the excitation light from light emitting element 11 in a radial manner.

If a resin mold is used for light conversion structural section 16, a transparent resin such as a silicone resin, an epoxy resin, and an acrylic resin can be exemplified as a material for the resin mold. It is more preferable to select a silicone resin, from the viewpoint that it is suitable to be used for an illumination device. Since the silicone resin is less likely to absorb light at a short wavelength (in the vicinity of 400 nm) as seen in an epoxy resin, it is suitable to be used for an illumination device.

A light emitting device emitting light of a desired color can be fabricated by selecting the type of the phosphor contained in the resin mold of the light conversion structural section as appropriate. For example, if a semiconductor laser element as light emitting element 11 emits light with a wavelength of 405 nm, a light emitting device emitting light of a desired color can be formed by adjusting a volume ratio, a mass ratio, and the like of phosphors emitting red light, blue light, and green light, respectively.

Further, by combining the wavelength of light emitted by the phosphor with the wavelength of the light emitted by the light emitting element as appropriate, a light emitting device emitting light of various colors including white light and capable of being utilized as an illumination device can be manufactured with good yield and at low cost.

<Light Emitting Element>

Preferably, light emitting element 11 used for the light emitting device of the present invention is a semiconductor laser element, from the viewpoint of emitting light having high energy and emitting light exciting the phosphor. As such a semiconductor laser element, it is preferable to use a semiconductor laser element emitting light with a wavelength of 390 to 460 nm.

<<Manufacturing Method>>

A method of manufacturing the light emitting device in the present embodiment will be described with reference to FIGS. 3 to 6.

Figure 3:
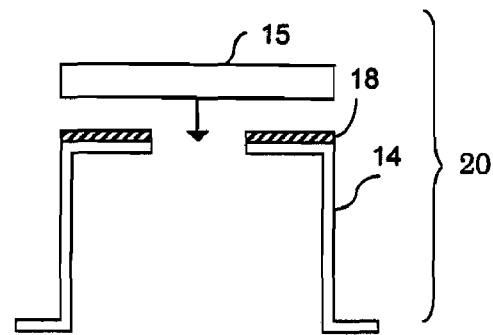
FIG. 3 is a view showing a manufacturing process of a cap used for the light emitting device of the present invention.

FIG. 3 is a view showing a manufacturing process of the cap used for the light emitting device in the present embodiment. As shown in FIG. 3, glass section 15 is placed on base section 14 with low-melting-point glass 18 sandwiched therebetween, and thereby the hole provided in base section 14 can be covered. Then, by heating base section 14 to not less than 650° C., a surface of base section 14 is changed into an oxide film, and the oxide film is melted and mixed with low-melting-point glass 18, firmly bonding glass section 15 to base section 14. Cap 20 is thereby fabricated.

Figure 4:
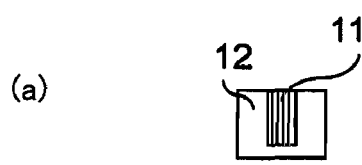
FIG. 4 is a view showing a step of placing a light emitting element on a submount and placing the submount on a stem.
Figure 4:
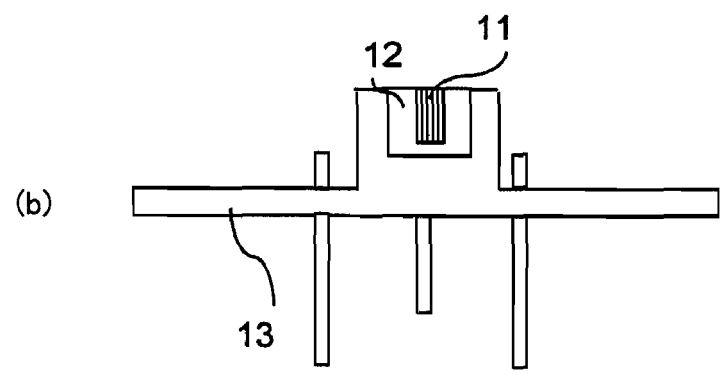
Figure 4:
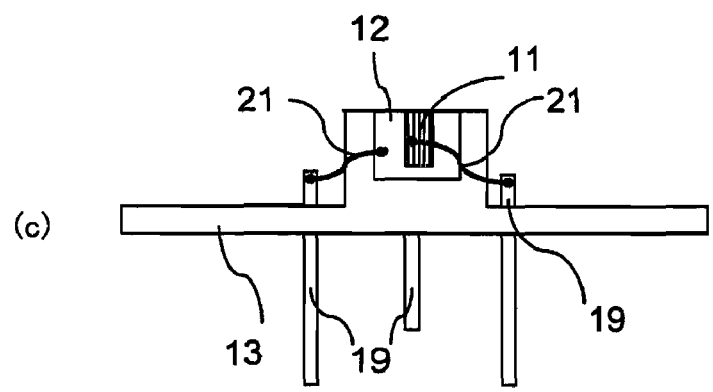

FIG. 4 is a view showing a step of placing the light emitting element on the submount and placing the submount on the stem. As shown in FIG. 4(a), for example, a semiconductor laser element as light emitting element 11 is soldered onto submount 12. Next, as shown in FIG. 4(b), submount 12 to which light emitting element 11 has been soldered is soldered onto stem 13. Subsequently, as shown in FIG. 4(c), light emitting element 11 and submount 12 are connected to a lead 19 via a wire 21.

Figure 5:
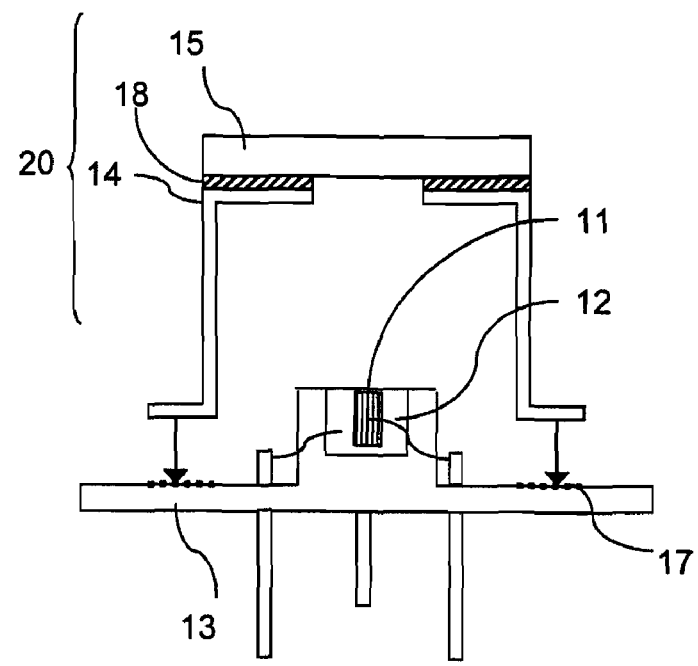
FIG. 5 is a view showing a step of placing the cap on the stem.

FIG. 5 is a view showing a step of placing the cap on the stem. Cap 20 is welded to stem 13 at weld section 17, and thereby light emitting element 11 is sealed with cap 20. In the present embodiment, light emitting element 11 is sealed inside cap 20 in dry air.

Figure 6:
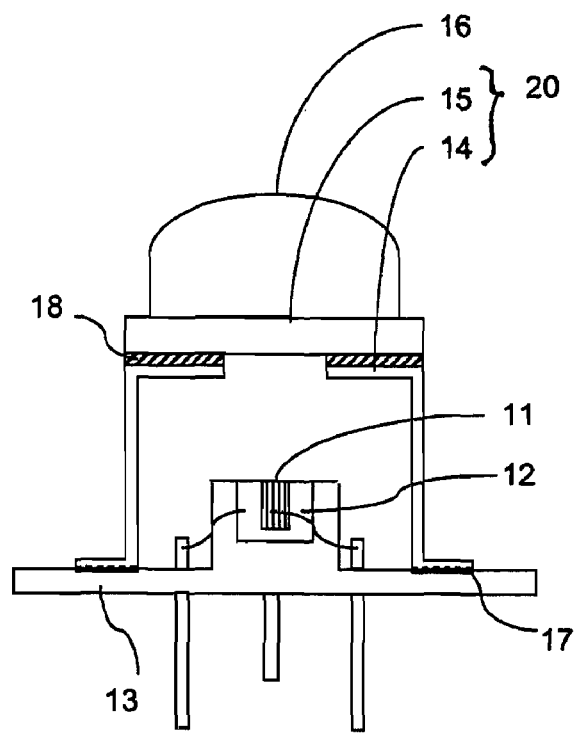
FIG. 6 is a view showing a step of placing a light conversion structural section on the cap.

FIG. 6 is a view showing a step of placing the light conversion structural section on the cap. As shown in FIG. 6, the light emitting device in the present embodiment can be fabricated by bonding a resin mold containing a phosphor as light conversion structural section 16 onto glass section 15.

In the manufacturing process of the light emitting device in the present embodiment, a problem that a pressure is exerted on glass section 15 when light conversion structural section 16 is bonded thereto and glass section 15 falls onto light emitting element 11, or that a bonded section between glass section 15 and base section 14 delaminates a little, sealing is thereby broken, and the performance of a laser chip is deteriorated, can be overcome. Thereby, the light emitting device can be manufactured with good yield, and thus manufacturing cost can be reduced. The light emitting device fabricated as described above can be utilized as a high-brightness illumination device.

Second to Fifth Embodiments

FIGS. 7 to 10 are schematic cross sectional views showing light emitting devices in second to fifth embodiments of the present invention. However, in any of the light emitting devices of FIGS. 7 to 10, low-melting-point glass 18 used for bonding between cap 20 and base section 14 is omitted.

Figure 7:
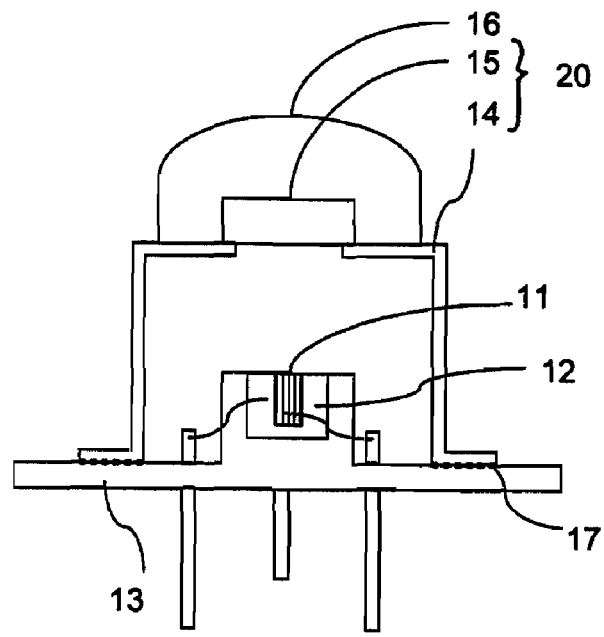
FIG. 7 is a schematic cross sectional view showing a light emitting device in a second embodiment of the present invention.

The light emitting device in the second embodiment of the present invention may have a shape such that, as shown in FIG. 7, glass with dimensions enough to cover the hole is placed on base section 14, and the glass is covered with light conversion structural section 16.

Figure 8:
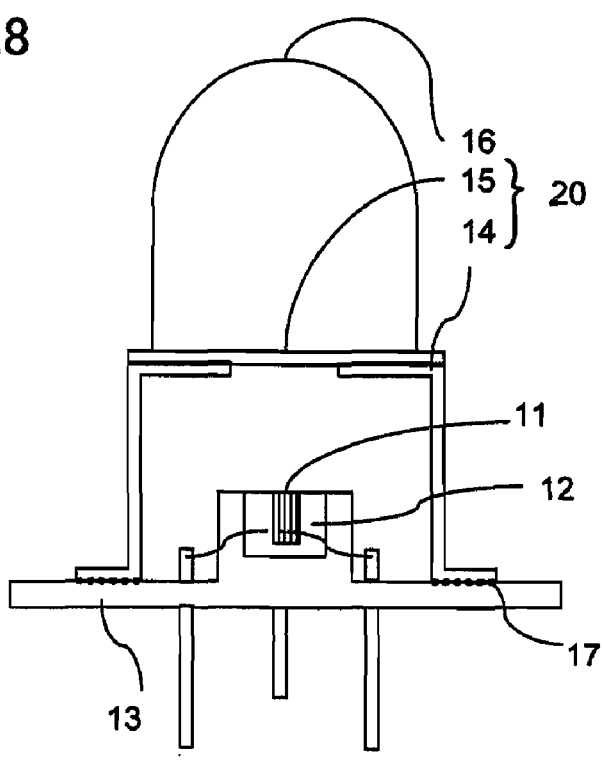
FIG. 8 is a schematic cross sectional view showing a light emitting device in a third embodiment of the present invention.

In the light emitting device in the third embodiment of the present invention, as shown in FIG. 8, light conversion structural section 16 having an artillery shell shape obtained by forming an end of a cylinder to have a hemispherical shape may be used. When light conversion structural section 16 has an artillery shell shape, it can emit the excitation light from light emitting element 11 with the highest luminous flux (1 m).

Figure 9:
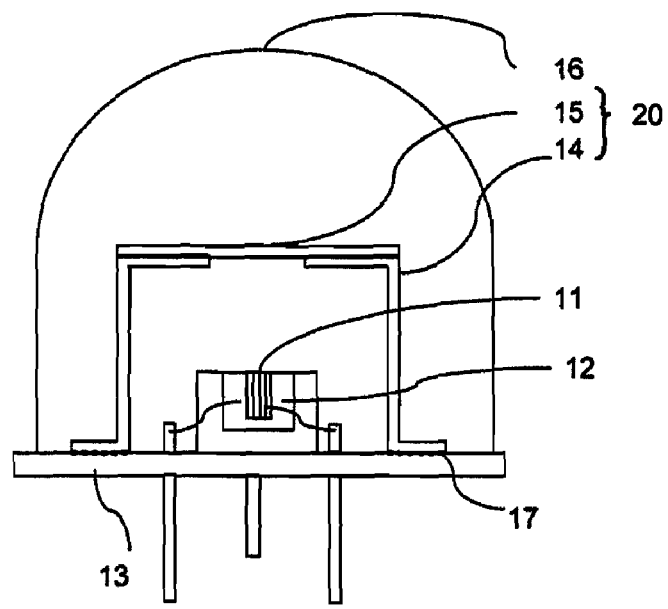
FIG. 9 is a schematic cross sectional view showing a light emitting device in a fourth embodiment of the present invention.

The light emitting device in the fourth embodiment of the present invention may have a shape such that, as shown in FIG. 9, light conversion structural section 16 covers entire cap 20. By covering entire cap 20 with light conversion structural section 16 as described above, higher air tightness can be achieved, and glass section 15 can be firmly fixed.

Figure 10:
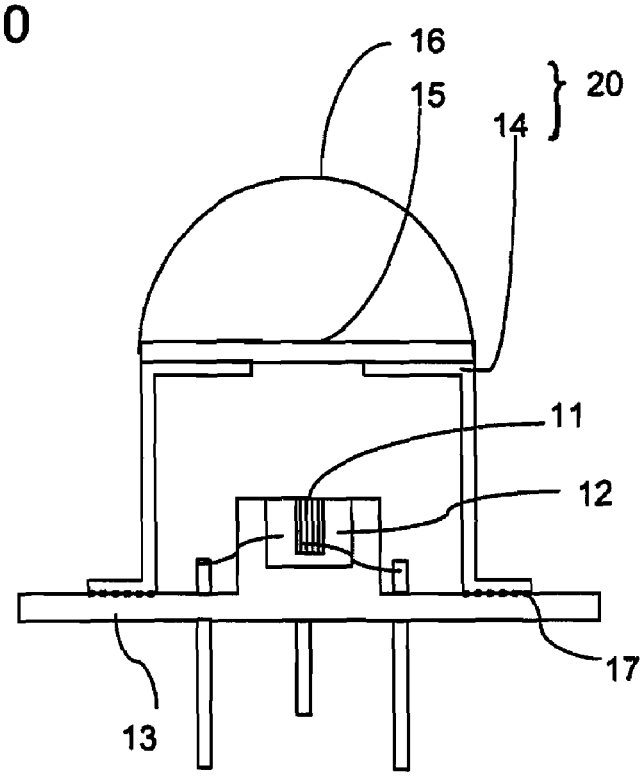
FIG. 10 is a schematic cross sectional view showing a light emitting device in a fifth embodiment of the present invention.
Figure 11:
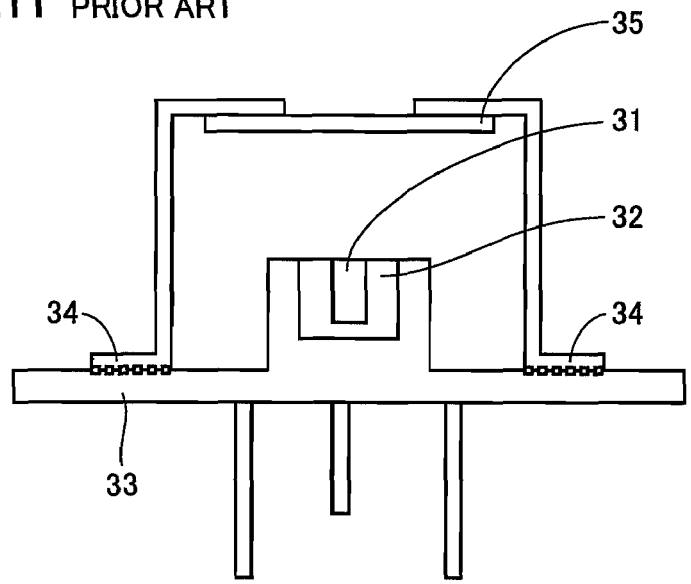
FIG. 11 is a cross sectional view showing one form of a conventional light emitting device using a semiconductor laser element.
Figure 12:
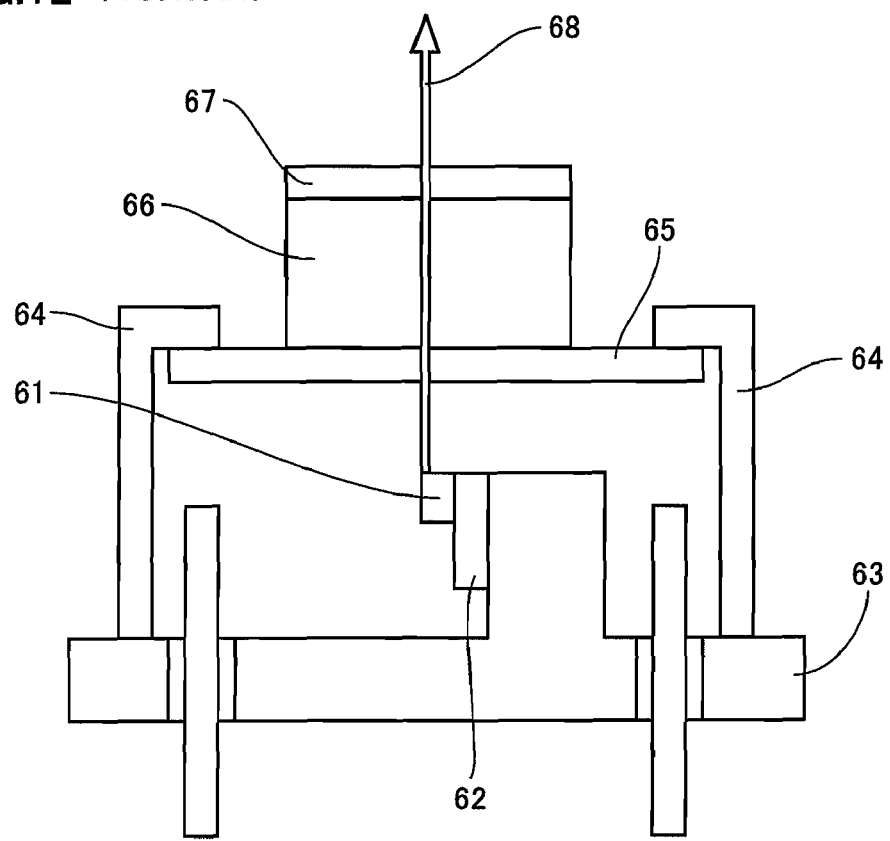
FIG. 12 is a cross sectional view showing another form of a conventional light emitting device using a semiconductor laser element.

In the light emitting device in the fifth embodiment of the present invention, as shown in FIG. 10, a lens may be used as light conversion structural section 16. By using a lens as light conversion structural section 16, the light emitting device can have a structure suitable for coupling with a fiber.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

According to the present invention, a light emitting device of which manufacturing cost is reduced by suppressing reduction in yield can be provided.

DESCRIPTION OF THE REFERENCE SIGNS

11: light emitting element, 12, 32, 62: submount, 13, 33, 63: stem, 14: base section, 15, 35, 65: glass section, 16: light conversion structural section, 17: weld section, 18: low-melting-point glass, 19: lead, 20, 34, 64: cap, 21: wire, 31, 61: semiconductor laser element, 66: wavelength conversion element, 67: functional film, 68: light.

The invention claimed is:

1. A light emitting device, comprising:
a light emitting element;
a cap sealing said light emitting element; and
a light conversion structural section covering an upper surface of said cap,
wherein said cap includes a base section having a hole for taking out light emitted from said light emitting element, and a glass section overlaid on said hole,
said glass section is provided outside said base section, and
said light conversion structural section is provided outside said glass section.

2. The light emitting device according to claim 1, wherein said light conversion structural section is a resin mold containing a phosphor, and
said light emitting element emits excitation light exciting said phosphor.

3. The light emitting device according to claim 1, wherein said light emitting element is a semiconductor laser element.

4. The light emitting device according to claim 1, wherein the hole in the base section is formed in a flat surface region of the base section, and the glass section has an area larger than an area of said hole.

5. The light emitting device according to claim 1, wherein said light conversion structural section entirely covers said cap.

6. The light emitting device according to claim 1, wherein said light conversion structural section is configured as a lens.

* * * * *